United States Patent [19]

Lischke

[11] Patent Number: 4,724,328

[45] Date of Patent: Feb. 9, 1988

[54] LITHOGRAPHIC APPARATUS FOR THE PRODUCTION OF MICROSTRUCTURES

[75] Inventor: Burkhard Lischke, Munich, Fed. Rep. of Germany

[73] Assignee: Siemens Aktiengesellschaft, Berlin and Munich, Fed. Rep. of Germany

[21] Appl. No.: 824,237

[22] Filed: Jan. 30, 1986

[30] Foreign Application Priority Data

Feb. 12, 1985 [DE] Fed. Rep. of Germany ....... 3504714

[51] Int. Cl.$^4$ ............................................ H01J 37/00
[52] U.S. Cl. ............................ 250/492.2; 250/396 R; 250/398
[58] Field of Search ........... 250/396 R, 396 ML, 398, 250/492.2; 219/121 EB

[56] References Cited

U.S. PATENT DOCUMENTS

| | | | |
|---|---|---|---|
| 4,130,761 | 12/1978 | Matsuda | 250/398 |
| 4,153,843 | 5/1979 | Pease | 250/396 R |
| 4,200,794 | 4/1980 | Newberry | 250/396 ML |
| 4,409,487 | 10/1983 | Kuschel et al. | 250/398 |
| 4,430,570 | 2/1984 | Takigawa | 250/396 R |
| 4,472,636 | 9/1984 | Hahn | 250/398 |
| 4,498,952 | 2/1985 | Christensen | 250/396 R |
| 4,633,090 | 12/1986 | Hahn | 250/398 |

OTHER PUBLICATIONS

IEEE Transactions on Electron Devices, vol. ED-26, No. 4, Apr. 1979, Recent Advances in Electron-Beam Lithography for the High Volume Production VLSI Devices, pp. 663-674.

Design and Testing of a Corrected Projection Lens System for Electron-Beam Lithography appearing in Siemens Forsch.-U. Entwickl.-Ber.Bd. 9 (1980) No. 3.

*Primary Examiner*—Bruce C. Anderson
*Attorney, Agent, or Firm*—Hill, Van Santen, Steadman & Simpson

[57] ABSTRACT

Lithographic apparatus for producing microstructures which comprises a particle beam source 1 and a condenser lens system 2, 3 and a controllable aperture diaphragm 4 having line-shaped multi-hole structures 17 .. . 22 for generating a plurality of particle beam fingers. A blanking diaphragm and an imaging optic structure 6, 7 OL are also provided. The invention produces a higher output of exposed structures than the prior art and for this purpose the particle beams are combined to form a ribbon beam which has the greatest cross-sectional dimension 12, 13 approximately in the longitudinal direction 23 of the line-shaped multi-hole structure 17 . . . 22 and which has the smallest cross-sectional dimension which does not significantly exceed the width of the multi-hole structure. The multiple beams are utilized in lithographic apparatus for generating semiconductor circuits in the submicrometer region on a GaAs base and for generating components for optical communications technology.

16 Claims, 7 Drawing Figures

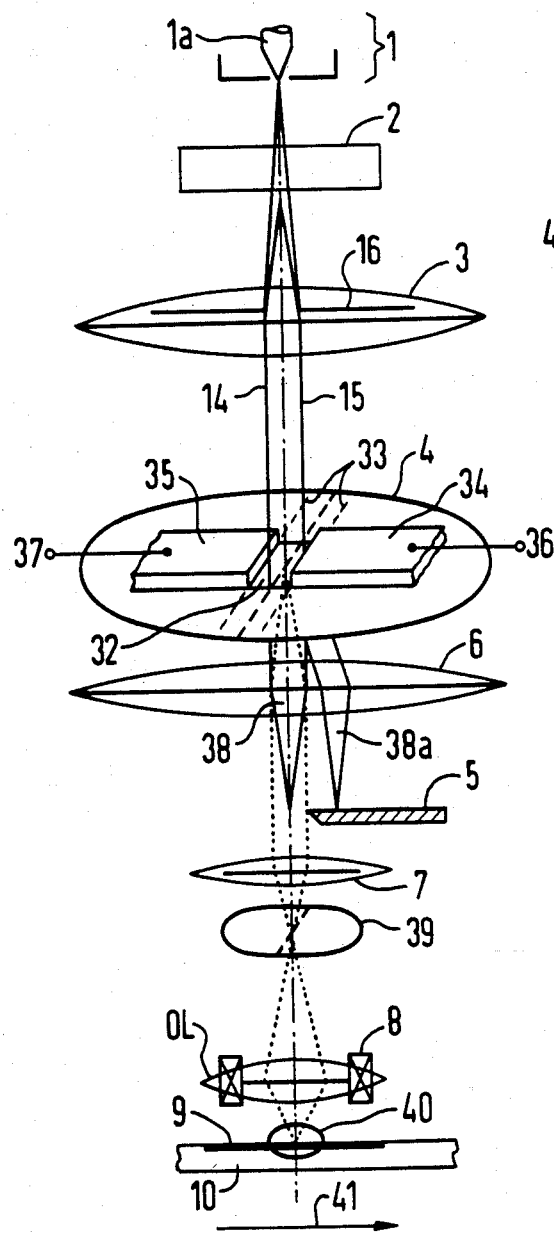
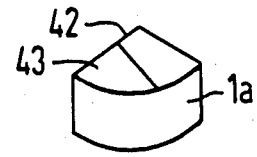
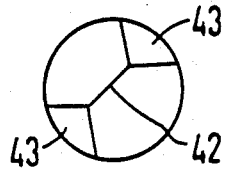

LITHOGRAPHIC APPARATUS FOR THE PRODUCTION OF MICROSTRUCTURES

CROSS-REFERENCE TO RELATED APPLICATIONS

This application is related to application Ser. No. 824,239, filed Jan. 30, 1986 entitled APERTURE DIAPHRAGM FOR A LITHOGRAPHY APPARATUS by Burkhard Lischke assigned to Siemens Aktiengesellschaft.

BACKGROUND OF THE INVENTION

1. Field of the Invention

The invention relates in general to lithographic apparatus for producing microstructures particularly for semiconductor devices.

2. Description of the Prior Art

The article entitled "Recent Advances in Electron Beam Lithography for the High Volume Production of VLSI Devices by Hans C. Pfeiffer which appears in the IEEE Transactions on Electron Devices, Vol. ED-26, No. 4, April 1979, pages 663-674 illustrates electron beam lithography devices in particular in FIGS. 3 and 4. By using a number of particle beams simultaneously, a higher output of exposed semiconductor structures can be produced than using a lithography apparatus which has only one beam which sweeps the surface to be structured in a grid-like manner. The manufacturer of semiconductor structures by means of a lithographic apparatus is described in the article published in English entitled "Design and Testing of a Corrected Projection Lens System for Electron-Beam Lithography by K. Anger, J. Frosien and B. Lischke published in the Siemens Forsch.-U. Entweickl. - Ber. Bd. 9 (1980) No. 3, Pages 174-178. Note, particularly, in this publication, FIG. 8 and the text on page 178. In the lithography apparatus disclosed by the IEEE Transactions article cited above, every individual particle beam can be deflected by applying a blanking voltage to a deflection capacitor which has electrodes mounted at the side edge relative to the particular beam generating recesses of the aperture diaphram and they are deflected to a degree such they impinge the blanking diaphragm and are thus blanked out of the further beam pass. There is a disadvantage, however, in that the beam generating recesses which have dimensions that are extremely small as compared to the dimensions of the circular area on the aperture diaphragm illuminated by the particle beam source only allow relatively low beam currents. Each diminution of the current of the beams however, leads to an increase in the time required for illumination of the areas of the resist to be exposed which receive the particle beams so that higher output which was anticipated in this apparatus as compared to the lithography apparatus using a single beam is only partially achieved.

The two articles referenced above are hereby incorporated by reference in the present application.

SUMMARY OF THE INVENTION

It is an object of the present invention to provide a lithography apparatus which enables a significantly higher output of exposed microstructures than prior art lithography apparatus and this is achieved by utilizing a particle beam source, a condenser lens system and a controllable aperture diaphragm having a line-shaped multi-hole structure for generating the plurality of particle beam fingers and a blanking diaphragm and an imaging optics and a body which is to be formed such as a semiconductor wherein the particle beams form a ribbon beam whose greatest cross-sectional dimension lies roughly in the longitudinal direction of the line shaped multi-hole structure and whose smallest cross-sectional dimension does not significantly exceed the width of the multi-hole structure.

The advantage obtainable with the invention lies particularly in that the particle beams carry relatively high beam current despite the small dimensions of the beam generating recesses and, therefore, allow high speed exposures for the individual areas of the resist.

Other objects, features and advantages of the invention will be readily apparent from the following description of certain preferred embodiments thereof taken in conjunction with the accompanying drawings although variations and modifications may be effective without departing from the spirit and scope of the novel concepts of the disclosure and in which:

BRIEF DESCRIPTION OF THE DRAWINGS

FIG. 2 is a schematic illustration of the invention;

FIG. 3 is a perspective view of a single crystal cathode for the of apparatus FIG. 1;

FIG. 4 is a plan view of the single crystal cathode of FIG. 3;

DESCRIPTION OF THE PREFERRED EMBODIMENTS

Figure 1:
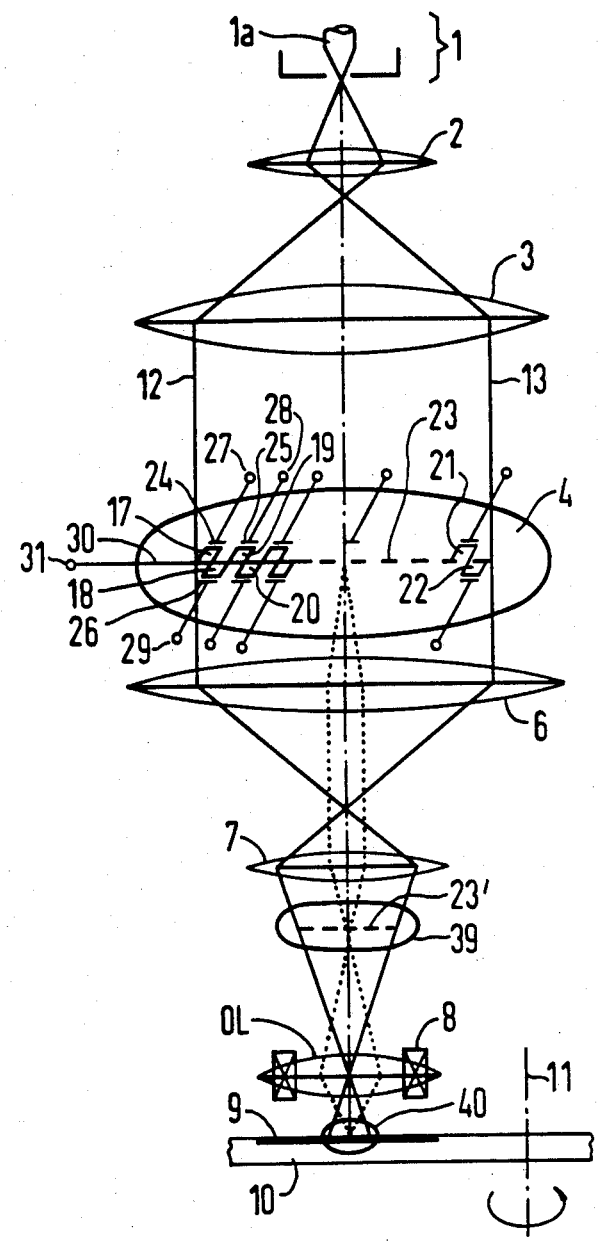
FIG. 1 is a schematic diagram of a lithography apparatus according to the invention.

FIGS. 1 and 2 illustrate an electron beam source 1 which produces an electron beam which passes to a cylindrical lens 2 and then to a condenser lens 3 and then to a controllable aperture diaphragm 4. A blanking diaphragm 5 is illustrated in FIG. 2 and imaging optics composed of lens 6, 7 and 8 and an objective lens OL and a deflection system 8 are provided so as to expose a body 9 which is mounted on a suitable mechanical support 10 which can expediently be mounted on a rotatable axis so as to rotate about a vertical shaft 11. The body 9 might be a semiconductor body, for example.

Electron beams emerge from a cathode 1a and are combined by the cylindrical lens 2 and the condenser lens 3 to form a ribbon-shaped beam which is limited by the marginal limits 12 and 13 illustrated in FIG. 1. FIG. 2 illustrates the beam between the limits 12 and 13 at right angles to the view of FIG. 1 and illustrates the marginal limits 14 and 15 which comprise the limits in the transverse dimension as shown in FIG. 2. The cross-section of the ribbon beam is dimensioned so that it is significantly larger parallel to the plan view of FIG. 1 then parallel to the plan view of FIG. 2. A slit diagram 16 which causes a limitation of the ribbon beam into the marginal limits rays 14 and 15 is expediently provided between the cylindrical lens 2 and the condenser lens 3 and this is illustrated in FIG. 2.

The aperture diaphragm 4 is disk-shaped and is provided with a line-shaped multi-hole construction. In the embodiment illustrated in FIG. 1, rectangular or quadratic recesses 17 through 22 are provided for this purpose and these respectively eminate from a middle broken line 23 and are alternately offset toward one and toward the other side of the disk 4 as illustrated.

For example, the recesses 17, 19 . . . 21 lie on one side of the broken line 23 and the recesses 18, 20, . . . 22 lie on the other side of the broken line 23. Respective electrodes 24 through 26 are connected to terminals 27 through 29 and are mounted at the sides of the recesses which lie on opposite sides of line 23. An additional electrode 30 extends along the line 23 and represents a counter electrode which is shared by all of the recesses and it is connected to a terminal 31.

In the embodiment illustrates in FIG. 2, the multi-hole structure is composed of a series of rectangular or quadratic recesses 32 which lie along the line 23 and the recesses 32 are not offset relative to each other. For reasons of clarity, only one recess 32 is illustrated and it has been greatly magnified and enlarged and the remaining recesses are indicated by broken line 33. Respective electrodes 34 and 35 which are connected to terminals 36 and 37 are mounted at the edges of the recesses 32 as illustrated.

The ribbon beam is a line such that its greatest cross-sectional dimension established by the rays 12 and 13 is in the dimension 23 which lies in the plane of the paper of FIG. 1 and the smallest dimension is perpendicular to line 23 and is illustrated in FIG. 2 and the smallest dimension corresponds to or is only slightly larger than the width of the multi-hole structure considering a possible mutual offset of the recesses such as in FIG. 1 into consideration. It is thus assured that only the immediate region of the multi-hole structure is illuminated by the ribbon-shaped beam so that a large part of the energy emitted by the electron beam source 1 is available for the shaping of the multiple electron beams. Each of these beams is composed of a part of the ribbon beam which passes through one of the recesses 17 through 22 or 32. In FIG. 2, the electron beam is finger-shaped by the recess 32 and is indicated by numeral 38. When a voltage is applied to the electrode 34 which is more positive than the voltage applied to the electrode 35 through the terminals 36 and 37, then the finger beam 38 will be deflected into the position 38a and will thereby be intercepted by the blanking diaphragm 5 so that it is blanked out of the beam path. Every beam finger which is not deflected, for example, a beam finger indicated by numeral 38, will be available for exposure of the surface of the body 9 or of a resist which is applied on the body 9. For the purpose of blanking a beam finger formed in accordance to the structure of FIG. 1 by the recess 17, the electrode 24 is supplied with a positive voltage whereas the electrode 31 receives a reference voltage. When a beam finger formed by the recess 18 is to be blanked then a negative voltage is applied to electrode 26. With the slit-diaphragm 5 shaped as a slit a positive voltage at 26 can also be utilized.

It is also illustrated from the beam path shown that the beam finger cross-sections which are established in the plane of the aperture diaphragm 4 by the dimensions of the recesses as, for example, recess 17 are image demagnified in a plane 39 by the lenses 6 and 7 and this corresponds to a reduction of the line 23 to a line 23' as illustrated in FIG. 1. The objective lens OL then images the cross-section of the electron beam fingers which have been reduced or demagnified onto the surface of the body 9 and such beam is indicated by numeral 40 in FIGS. 1 and 2 for example, The resist is exposed on the body 9 according to FIG. 1 such that all of the electron beam fingers which are not blanked out are moved for example by means of the deflection system 8 relative to the body 9 in a direction roughly perpendicular to the projection of the line 23 and they are moved by a beam finger dimension after the exposures of the areas on body 9 after they have impinged on the resist or the body. The neighboring beam finger line is next exposed in an analogous manner. An arbitrary exposure pattern can be generated on the surface 9 by individual driving the electrodes on the aperture diaphragm and the smallest structural detail in the body 9 corresponds to the cross-sectional dimensions of a beam finger measured on the surface of the body 9. Also, by analogy in FIG. 2, the total beam fingers are not blanked out or respectively shifted after an exposure occurs by a projected beam finger dimension which is then shifted relative to the body 9 as indicated by the arrow 41. The dotted beam paths on FIGS. 1 and 2 illustrate the imaging of the recesses 17 and so forth of the aperture diaphragm onto the surface of the body 9.

FIG. 3 illustrates a preferred embodiment of the cathode 1a which is in the form of a single crystal pin, bolt or stud-shaped cathode of lanthanum hexaborid ($LaB_6$) which extends out to a knife blade surface 42. This shaped is obtained for example, by grinding a cylindrical pin, bolt or stud cathode from two sides so that a knife blade surface 42 is formed with the length of the knife blade surface corresponding to the diameter of the pin or bolt or stud. Then two further faces 43 are ground which define the length of the knife blade surface 42 between them. The knife blade surface 42 and the faces 43 are clearly illustrated in the plan view of FIG. 4. The ground faces preferably correspond to the <100> planes of the crystal or other planes which represent faces having a low work function.

Figure 5:
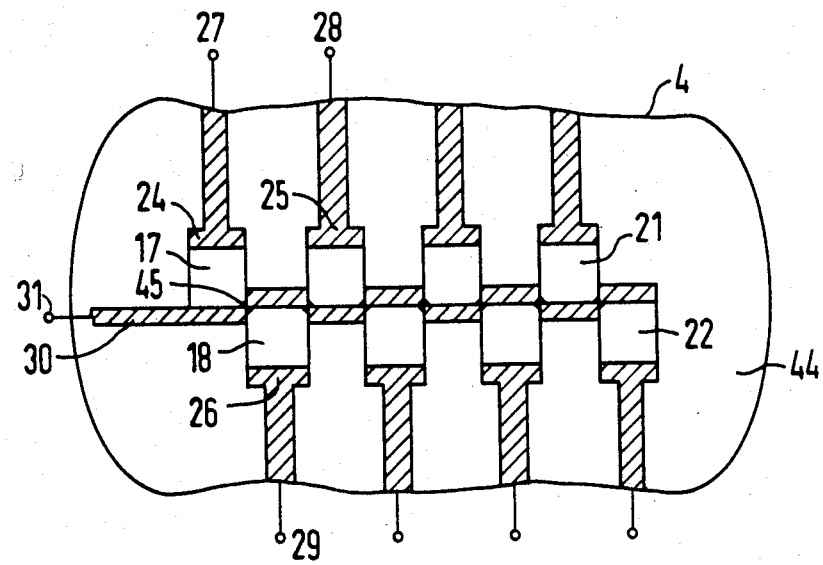
FIG. 5 illustrates a preferred embodiment of the controllable aperture diaphragm of the apparatus of FIG. 1.

FIG. 5 illustrates a preferred embodiment of the aperture diaphragm 4. A high resistant substrate film of, for example, silicon is provided with the previously described recesses 17 through 22. The electrodes 24, 25, 26 and so forth which serve for beam blanking are formed as interconnects which are broadened at their ends which are made of gold for example. The common electrode 30 is preferably also formed of gold and extends meander-like between the recesses and is provided with adequately broad intermediate webs 45 so as to achieve good contact between the individual parts. The surface of the aperture diaphragm 4 which faces the electron beam source 1 is also provided with a conductive coating outside of the hole structures and the incident electrons are diverted by this coating.

Figure 6:
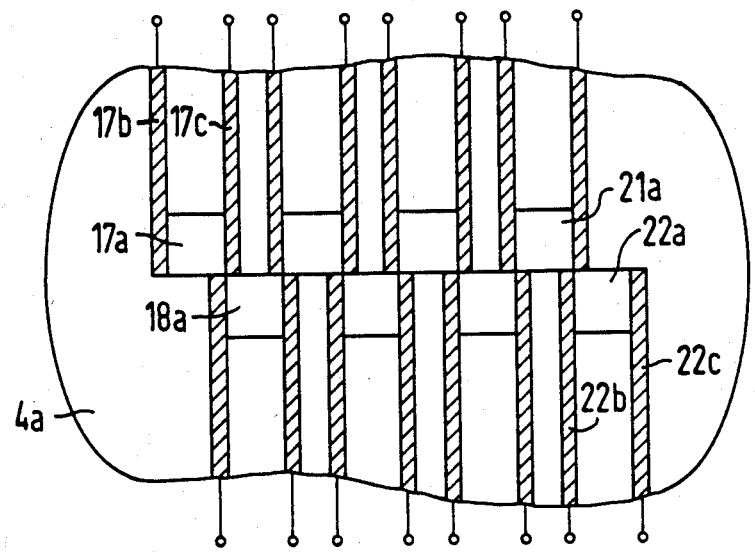
FIG. 6 illustrates a modified form of the aperture diaphragm which can be utilized in combination with the diaphragm of FIG. 5.

According to a further advantageous development, the aperture diaphragm 4 can be augmented by a further aperture diaphragm 4a as illustrated in FIG. 6. A high resistant substrate film is formed on the aperture diaphragm 4 and has recesses 17a through 21a which coincide with the recesses 17 through 21 and allow a precise mutual adjustment of the diaphragms. Pairs of electrodes such as 17b and 17c through 22b and 22c are connected to terminals and are connected to opposite edges of the recesses 17a through 22a as illustrated. Voltages which cause a deflection of the electron beam fingers parallel to the longitudinal direction of the line-shaped multi-hole structure are applied to the electrodes 17b through 22c so as to correct optical errors, for example, spherical aberration of the condenser lenses distortion of the optical images and so forth. The electrode structures of 4a are likewise advantageously formed as interconnects and are constructed of gold for example. The manufacture of the aperture diaphragms 4 and 4a can occur in planar technology with standard lithography methods.

The aperture diaphragms 4 or, respectively, 4a formed in the manner described and illustrated can be designed for a large number of recesses such as recess 17 for particular advantages. For example, 2,048 recesses may be utilized and a corresponding plurality of electron beam fingers are generated thereby. When using a quadratic-shape for the recesses 17 having a side length of 10 $\mu$m and with the beam dimension demagnified by a factor of 100 using imaging optics, then individual exposable image points having side lengths of 0.1 $\mu$m occur. With a finger beam current of about 5 nA for every finger beam, an exposure speed of about 1 $cm^2$/s results which gives a resist sensitivity of $C=10^{-5}As/cm^2$ and this corresponds to a production of about fifty 4" semiconductor wafers per hour. The length of the multiple-hole structure in the aperture diaphragm 4 will therefore be about 20.5 mm. For example, structures in the 0.1 $\mu$m range can be produced with such an apparatus which are required, for example, for integrated circuits on a GaAs base or for components of optical communications technology for example, lattice structures for solid state lasers.

Different aperture diaphragms which have recesses that are approximately dimensioned and positioned can be provided for different grid dimensions of the structures which are to be produced. However, structures which have a grid dimension which differ from the grid dimensions prescribed by the diaphragm can also be generated with a specific aperture diaphragm particularly when the departure tolerances lie within certain percentage ranges. A development of the lithographic apparatus of the invention having a variable imaging scale is illustrated in FIG. 7.

Figure 7:
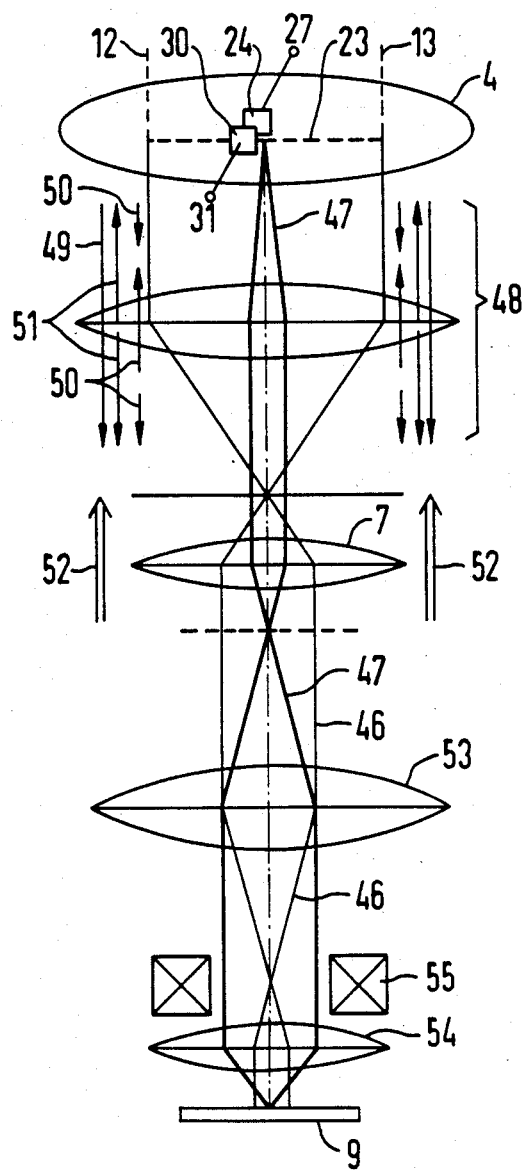
FIG. 7 is a schematic modification of the apparatus of FIG. 1 which allows imaging scale to be modified.

Only those parts of the lithography apparatus which are beneath the aperture diaphragm 4 are illustrated in FIG. 7. Those parts of the apparatus in FIG. 7 which correspond to those of FIG. 1 are arranged above the aperture 4 and are not repeated in FIG. 7. The electrodes 24 and 30 which are arranged at the side edge relative to the recesses 17 are not shown in detail in FIG. 7 and are indicated in FIG. 7 as capacitor plates. The illumination beam path is referenced as numeral 46 and 47 which represents the beam path for imaging the recess 17 onto the surface of the workpiece 9. The variation of the imaging scale occurs by using the zoom lens 48 which replaces the lens 6 of FIG. 1. Such a zoom lens has been previously mentioned on page 177 of the previously identified article Siemens Forschungs-und Entwicklungs-Berichte particularly in the textural material which describes FIG. 6. Such device comprises a main winding 49 which is supplemented by three auxiliary windings 50 represented by the arrows in FIG. 7 and which are symmetrically arranged relative to the longitudinal axis and allow an adjustment of the focal length. When the auxiliary windings 50 are supplied with current such that the middle winding thereof attenuates the main field generated by winding 49 and the lower and upper auxiliary windings 50 amplify the main field a deformation of the main field which corresponds to an increased focal length 48 occurs. With a reversal of the current in the auxiliary windings 50 a decrease in the focal length results. The effective lens excitation will not be influenced by these changes. Two additional windings 51 are also symmetrically arranged relative to the longitudinal axis of the lens 48 and they cause additional modifications of the lens field which are equivalent to the longitudinal displacement of the lens parts 49 and 50 in the direction toward the aperture diaphragm 4 or away from the aperture diaphragm 4. When the main field of the lens system 48 is attenuated by the upper winding 51 and is amplified by the lower winding 51 the effect of a downward longitudinal displacement of the main field 48 occurs. With a reversal of the current in the upper winding 51 and the lower winding 51 the effect on the main field will cause an upward longitudinal decrease. When the focal length of the system 48 is decreased and a displacement of the main lens field in the direction toward the aperture diaphragm 4 occurs for an amount corresponding to the decrease then the demagnification of the recesses 17 projected onto the workpiece 9 which is effected by the lenses 48 and 7 decrease whereby the beam finger cross-section effective for the exposure simultaneously increases so that a magnification of the grid dimension of the structure to be generated results. A reversal of the influencing effects on the main field 48 then cause a demagnification of the grid dimensions of the structure.

The lenses 48 and 7 comprise a telecentric beam path and oppositely identical excitations which is indicated by the arrows 52. As a consequence, twist chromatic aberrations, magnification chromatic aberrations and isotropic distortions of the lens system 48 and 7 are practically avoided.

In FIG. 7, the imaging optics is augmented by two further lenses 53 and 54 and the deflection system 55 is mounted between the lenses 53 and 54. The lenses 53 and 54 are also preferably formed with telecentric beam path and oppositely identical excitation so as to eliminate errors. Such a design of lens pairs is disclosed in German patent No. 2,515,549 for example. The Boersch effect is additionally minimized by employing ribbon beams according to the invention.

According with a further development of the invention between the relative movement between all of the electron beam fingers and the body 9 can also be achieved by movement of the mechanical stage 10 which supports the workpiece 9 as illustrated in FIG. 1, for example. In particular, a continuous rotational movement is also suitable for this purpose which can occur for example around the shaft 11 illustrated in FIG. 1. It is practical to use an irridation speed of about 1 $cm^2$/s which is calculated according to the above example. In case the aperture diaphragm 4 of FIG. 2 comprises a series of recesses 32 which are not offset relative to each other whose mutual spacings correspond to the side length of a recess, a displacement of the electron beam fingers by such side length in the direction of the line 23 must occur after every individual exposure operation within the same line setting of the electron beam fingers so that a complete exposure of the body 9 is assured. Such dislocation can advantageously be made by using a deflection system 8 or, respectively, 55.

The inventive idea comprises not only the embodiments described wherein electron beam fingers are employed but also wherein other particle lithography apparatus which, for example, operate with ion beams are used.

Although the invention has been described with respect to preferred embodiments, it is not to be so limited as changes and modifications can be made which are within the full intended scope of the invention as defined by the appended claims.

I claim as my invention:

1. A lithography apparatus for producing microstructures comprising, a particle beam source, a condenser lens system (2, 3), a controllable aperture diaphragm (4) having a line-shaped multi-hole structure (17 . . . 22) for generating a plurality of particle beam fingers, a blanking diaphragm (5), an imaging optics (6, 7, OL) and a workpiece particularly a semiconductor body (9), characterized in that the particle beam is formed into a ribbon beam with a larger cross-sectional dimension (12, 13) which extends roughly in the longitudinal direction (23) of said line-shaped multi-hole structure (17 . . . 22) and which has a smaller cross-sectional dimension which does not significantly exceed the width of said multi-hole structure, deflection electrodes for individual blanking of the particle probes are mounted on the aperture diaphragm; said deflection electrodes are formed as conducting paths connected and are arranged at the edges of the holes of the multi-hole structure.

2. A lithography apparatus according to claim 1, characterized in that a cylindrical lens (2) which generates said ribbon beam is provided between said particle beam (1) and said aperture diaphragm (4).

3. A lithogrpahy apparatus according to claims 1 or 2, characterized in that said particle beam source (1) contains a pin-shaped single-crystal cathode (1a) which is formed with a knife-blade portion.

4. A lithography apparatus according to claim 3, characterized in that said pin-shaped single-crystal cathode (1a) is composed of LaB$_6$.

5. A lithography apparatus according to claim 1 or claim 2 characterized in that said multi-hole structure of said aperture diaphragm (4) comprises approximately rectangular or quadratic recesses (17 . . . 22) which emanate from a center line (23) and are respectively alternatively offset toward one and the other side; and in electrodes (24, 30) for the deflection of the particle beam fingers generated by the recesses are mounted at the sides of every recess (17) which emanate from said center line (23).

6. A lithography apparatus according to one of the claim 1 or claim 2, characterized in that said multi-hole structure of said aperture diaphragm (4) comprises approximately rectangular or quadratic recesses (32) which are mounted along a line (23) and have mutual spacings which correspond to their dimensions in the direction of said line (23); and in that electrodes (34, 35) are mounted at the sides of every recess (32) parallel to said line, and are positioned for deflecting of the particle beam fingers generated by a recess (32).

7. A lithography apparatus according to claim 5 characterized in that said aperture diaphragm is composed of a high-resistant substrate, particularly of silicon or silicon dioxide, on which said electrodes (24, 30, 34, 35) are formed in the form of interconnects and which are provided with terminals for supplying blanking voltages thereto.

8. A lithography apparatus according to claim 7, characterized in that said interconnects are formed of gold.

9. A lithography apparatus according to claim 5, characterized in that the electrodes mounted in the region of said center line (23) associated with some or all said recesses (17 . . . 22) are combined to form a common electrode (30), and said electrodes are connected to each other by intermediate webs.

10. A lithography apparatus according to claim 7 characterized in that said substrate is provided with a conductive coating for diverting the incident particles and which is provided outside of said multi-hole structure on the side facing said particle beam source (1).

11. A lithography apparatus according to claim 1 characterized in said aperture diaphragm (4a) comprises recesses (17a . . . 22a) said recesses being penetrated by the particle beam fingers; and further electrodes (17b, 17c . . . 22b, 22c) are provided at the sides of said recesses (17a . . . 22a) which extend perpendicular to the center line (23) of said multi-hole structure, said further electrodes serves for deflecting the particle beam fingers in the direction of said center line (23).

12. A lithography apparatus according to claim 1 or claim 2, characterized in that a magnetic or electric zoom lens (48) is provided between said aperture diaphragm (4) and said semiconductor body (9) for the purpose of varying the imaging scale, and the focal length and effective spacing from said aperture diaphragm (4) of said zoom lens being variable in the same direction.

13. A lithography apparatus according to claim 12, characterized in that said zoom lens (48) comprises three additional auxiliary windings (50) in addition to the winding (49) which generates the main field, said auxiliary windings respectively positioned symmetrically relative to the longitudinal lens axis, and for effecting a focal length adjustment, and the center auxiliary winding thereof attenuating or, respectively, amplifying said main field and the other two auxiliary windings amplifying or, respectively, attenuating said main field; and two further lens windings are respectively provided symmetrically relative to the longitudinal lens axis with one thereof respectively attenuating said main field and the other respectively amplifying said main field so that said main field which is changed to cause a longitudinal displacement of said zoon lens (48).

14. A lithography apparatus according to claim 1 or claim 2 characterized in that the lenses of said imaging optics respectively comprise paired telecentric beam paths and are subjected to oppositely applied identical excitations.

15. A lithography apparatus according to claim 1 or claim 2 characterized in that said body (9) is movable mounted in a direction (41) roughly perpendicular to the longitudinal direction (23) of said line-shaped hole structure (17 . . . 22) and parallel to the surface of said body (9) which is to be structured.

16. A lithography apparatus according to claim 15, characterized in that said body (9) is mounted on a rotating support (10) which is rotatable around a shaft (11) mounted a fixed distance from said body (9).

* * * * *